United States Patent
Hong et al.

(10) Patent No.: US 11,217,398 B2
(45) Date of Patent: Jan. 4, 2022

(54) BODIPY-BASED COPOLYMER AND SOLAR CELL COMPRISING SAME

(71) Applicant: GWANGJU INSTITUTE OF SCIENCE AND TECHNOLOGY, Gwangju (KR)

(72) Inventors: Sukwon Hong, Gwangju (KR); Minkyu Kyeong, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 16/643,726

(22) PCT Filed: Jul. 20, 2018

(86) PCT No.: PCT/KR2018/008212
§ 371 (c)(1),
(2) Date: Mar. 2, 2020

(87) PCT Pub. No.: WO2019/045272
PCT Pub. Date: Mar. 7, 2019

(65) Prior Publication Data
US 2020/0219664 A1 Jul. 9, 2020

(30) Foreign Application Priority Data
Aug. 31, 2017 (KR) .......................... 10-2017-0111262

(51) Int. Cl.
*H01G 9/20* (2006.01)
*C08G 61/12* (2006.01)
(Continued)

(52) U.S. Cl.
CPC .......... *H01G 9/2018* (2013.01); *C08G 61/126* (2013.01); *H01G 9/2009* (2013.01);
(Continued)

(58) Field of Classification Search
CPC .. H01G 9/2018; H01G 9/2009; C08G 61/126; C08G 2261/12; C08G 2261/1424;
(Continued)

(56) References Cited

U.S. PATENT DOCUMENTS 9,412,949 B2 8/2016 Liu
2018/0090711 A1* 3/2018 Gotanda ............. H01L 51/0029

FOREIGN PATENT DOCUMENTS

CN 102329418 A * 1/2012
CN 106905354 A 6/2017
(Continued)

OTHER PUBLICATIONS

Gourav Tarafdar "Effect of structural isomerism on charge transport in copolymer of BODIPY and Benzodithiophene" 2016 IEEE 43rd Photovoltaic Specialists Conference (PVSC), Portland, OR, 2016, pp. 1664-1669, (Year: 2016).*
(Continued)

*Primary Examiner* — Michael Y Sun
(74) *Attorney, Agent, or Firm* — Hauptman Ham, LLP

(57) ABSTRACT

The present invention relates to a boron-dipyrromethene (BODIPY)-based copolymer, a method for preparing the copolymer, a solar cell including the copolymer, and a method for manufacturing the solar cell. By applying the copolymer of the present invention to a hole transporting layer, a solar cell having improved device characteristics such as charge mobility and power conversion efficiency and allowing those characteristics to be maintained for a long time may be provided.

18 Claims, 6 Drawing Sheets

(51) Int. Cl.
  *H01L 51/00* (2006.01)
  *H01L 51/42* (2006.01)
  *H01L 51/44* (2006.01)

(52) U.S. Cl.
  CPC ...... *H01L 51/0036* (2013.01); *H01L 51/0043* (2013.01); *H01L 51/4253* (2013.01); *H01L 51/442* (2013.01); *C08G 2261/12* (2013.01); *C08G 2261/1424* (2013.01); *C08G 2261/3221* (2013.01); *C08G 2261/3243* (2013.01); *C08G 2261/512* (2013.01); *C08G 2261/91* (2013.01)

(58) Field of Classification Search
  CPC .... C08G 2261/3221; C08G 2261/3243; C08G 2261/512; C08G 2261/91; C08G 2261/344; C08G 2261/411; C08G 2261/414; C08G 2261/124; C08G 2261/3246; C08G 2261/1412; C08G 61/122; C08G 61/124; H01L 51/0036; H01L 51/0043; H01L 51/4253; H01L 51/442; H01L 51/4246; H01L 51/0046; H01L 51/008; H01L 2031/0344; H01L 51/4206; Y02E 10/542; Y02E 10/549; Y02P 70/50
  See application file for complete search history.

(56) References Cited

FOREIGN PATENT DOCUMENTS

| | | |
|---|---|---|
| JP | 2017-57266 A | 3/2017 |
| KR | 10-2008-0112280 A | 12/2008 |
| KR | 10-1608281 B1 | 3/2016 |
| KR | 10-1688222 B1 | 12/2016 |

OTHER PUBLICATIONS

Saumya Singh "Copolymers Comprising Monomers with Various Dipoles and Quadrupole as Active Material in Organic Field Effect Transistors" (Year: 2016).*

Lijuan Jiao "Unusual spectroscopic and photophysical properties of meso-tert-butylBODIPY in comparison to related alkylated BODIPY dyes" RSC Adv., 2015, 5, 89375-89388 (Year: 2015).*

Xiangwei Zhu "Improving the Performances of Random Copolymer Based Organic Solar Cells by Adjusting the Film Features of Active Layers Using Mixed Solvents" Polymers 2016, 8, 4; (Year: 2016).*

Sohee Choi "Aggregation-induced emission enhancement of a meso-trifluoromethyl BODIPY via J-aggregation" Chem. Sci., 2014, 5, 751 (Year: 2013).*

International Search Report issued for corresponding International Patent Application No. PCT/KR2018/008212 dated Oct. 26, 2018, along with an English translation.

Written Opinion issued for corresponding International Patent Application No. PCT/KR2018/008212 dated Oct. 26, 2018, along with an English translation.

Marta Liras et al., "New BODIPY chromophores bound to polyhedral oligomeric silsesquioxanes (POSS) with improved thermo- and photostability", Journal of Materials Chemistry, 2011, 21, pp. 12803-12811.

Notice of Allowance issued for corresponding Korean Patent Application No. 10-2017-0111262 dated Dec. 19, 2018.

* cited by examiner

K1: PREPARATION EXAMPLE 1
K3: PREPARATION EXAMPLE 3
K5: PREPARATION EXAMPLE 5
K6: PREPARATION EXAMPLE 6

BODIPY-BASED COPOLYMER AND SOLAR CELL COMPRISING SAME

CROSS REFERENCE TO RELATED APPLICATION

This application claims the priority of Korean Patent Application No. 10-2017-0111262, filed on Aug. 31, 2017, in the KIPO (Korean Intellectual Property Office). Further, this application is the National Phase Application of International Application No. PCT/KR2018/008212, filed on Jul. 20, 2018, which designates the United States and was published in Republic of Korea. Both of the priority documents are hereby incorporated by reference in their entireties.

TECHNICAL FIELD

The present invention relates to a boron-dipyrromethene (BODIPY)-based copolymer, a method for preparing the copolymer, a solar cell including the copolymer, and a method for manufacturing the solar cell.

BACKGROUND ART

Concerns about depletion of fossil fuels, environmental issues caused by abuse thereof, safety concerns associated with the use of nuclear energy, and so on have raised the need for power generation from solar energy, as a sustainable energy source. A total amount of solar energy arriving at the earth is 105 TW per hour on average, and only a small part of the received energy is enough to exceed an amount of energy of 20 TW which is expected to be required for the entire planet in 2020. Although not all of the energy received from the sun is able to be used, photovoltaic power generation has been regarded as one of the most attractive renewable power generation technologies due to relatively low regional deviations and eco-friendly characteristics thereof.

Solar cell technology is a technology of directly converting sunlight into electrical energy, and most of the commercialized solar cells are inorganic solar cells using an inorganic material such as silicon. However, manufacturing costs of the inorganic solar cells increase due to a complicated manufacturing process therefor and materials used to form the inorganic solar cells are expensive. For these reasons, extensive research has been carried out on organic solar cells which are manufactured by a relatively simple process with low manufacturing costs using inexpensive materials.

Perovskite solar cells have drawn attention as important devices since they have excellent photovoltaic properties and are manufactured by a relatively simple process with low manufacturing costs. In this regard, since perovskite solar cells without a hole transporting material (HTM) exhibit lower charge extraction than perovskite solar cells including an HTM and charge recombination at an interface, open-circuit voltages and charging rates decrease. Thus, in order to obtain higher power conversion efficiency (PCE), charge extraction needs to be increased and unwanted charge recombination at the interface needs to be suppressed. To this end, the role of the HTM is important in perovskite solar cells.

There are cases where various materials are used as HTMs of perovskite solar cells. Although a perovskite solar cell using spiro-OMeTAD as an HTM has a high power conversion efficiency of 15%, commercialization of the perovskite solar cell is limited since spiro-OMeTAD is difficult to synthesize, is expensive, and has low mobility of charge carriers. Meanwhile, when poly(3,4-ethylenedioxythiophene)polystyrene sulfonate (PEDOT:PSS) is used as a HTM, there may be disadvantages of decrease in stability although advantages such as high mobility of charge carriers and unnecessity of doping are achieved.

DESCRIPTION OF EMBODIMENTS

Technical Problem

An object of the present invention is to provide a novel hole transporting material, i.e., a novel BODIPY-based copolymer, for providing a solar cell having high efficiency and high stability by overcoming the above-described disadvantages of conventional hole transporting materials, and a method for preparing the same.

Another object of the present invention is to provide a solar cell having excellent device characteristics such as charge mobility and power conversion efficiency and allowing those characteristics to be stably maintained for a long time by applying the copolymer to a hole transporting layer.

Solution to Problem

According to an embodiment of the present invention, a copolymer represented by Formula 1 below is provided.

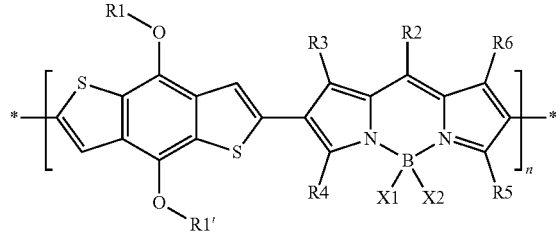

Formula 1

In Formula 1 above,

R1 and R1' are each independently a straight-chain or branched $C_4$ to $C_{30}$ alkyl group, alkenyl group, or alkynyl group, R2 is a straight-chain or branched $C_1$ to $C_{20}$ alkyl group unsubstituted or substituted with a halogen atom, or a straight-chain or branched $C_2$ to $C_{20}$ alkenyl group or alkynyl group, R3 to R6 are each independently a straight-chain or branched $C_1$ to $C_{20}$ alkyl group, or a straight-chain or branched $C_2$ to $C_{20}$ alkenyl group or alkynyl group, $X_1$ and $X_2$ are each independently a halogen atom, a repeat number n of a repeating unit is from 2 to 50, and a number average molecular weight (Mn) is from 1400 to 60000.

According to another embodiment of the present invention, a method for preparing a copolymer represented by Formula 1 below by polymerizing a compound represented by Formula 2 below and a compound represented by Formula 3 below are provided.

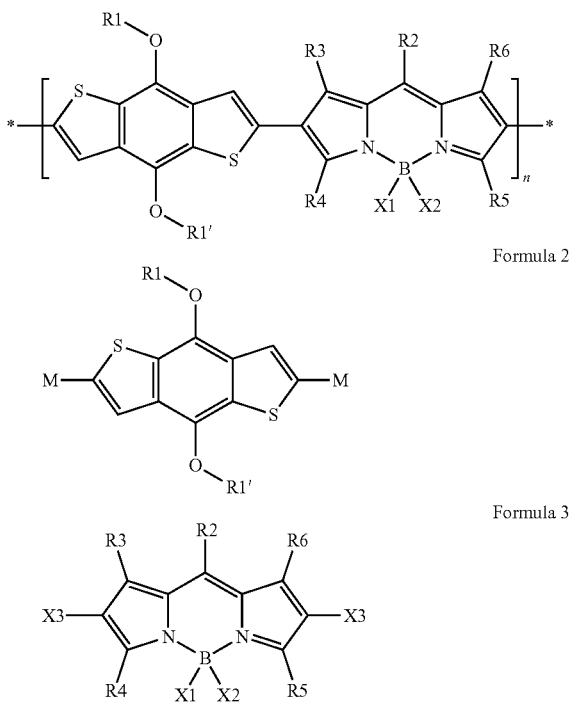

Formula 1

Formula 2

Formula 3

In the formulas above,

R1 and R1' are each independently a straight-chain or branched $C_4$ to $C_{30}$ alkyl group, alkenyl group, or alkynyl group, R2 is a straight-chain or branched $C_1$ to $C_{20}$ alkyl group unsubstituted or substituted with a halogen atom, or a straight-chain or branched $C_2$ to $C_{20}$ alkenyl group or alkynyl group, R3 to R6 are each independently a straight-chain or branched $C_1$ to $C_{20}$ alkyl group, or a straight-chain or branched $C_2$ to $C_{20}$ alkenyl group or alkynyl group, M is an organotin compound or an organoboron compound, $X_1$, $X_2$, and $X_3$ are each independently a halogen atom, a repeat number n of a repeating unit is from 2 to 50, and a number average molecular weight (Mn) is from 1400 to 60000.

According to still another embodiment of the present invention, a solar cell including the copolymer represented by Formula 1 above is provided.

According to still another embodiment of the present invention, a composition for forming a hole transporting layer of a solar cell, including the copolymer represented by Formula 1 above is provided.

Advantageous Effects of Disclosure

By applying the copolymer according to the present invention to a hole transporting layer, a solar cell having improved device characteristics such as charge mobility and power conversion efficiency and allowing those characteristics to be maintained for a long time may be provided.

BEST MODE

Figure 1:
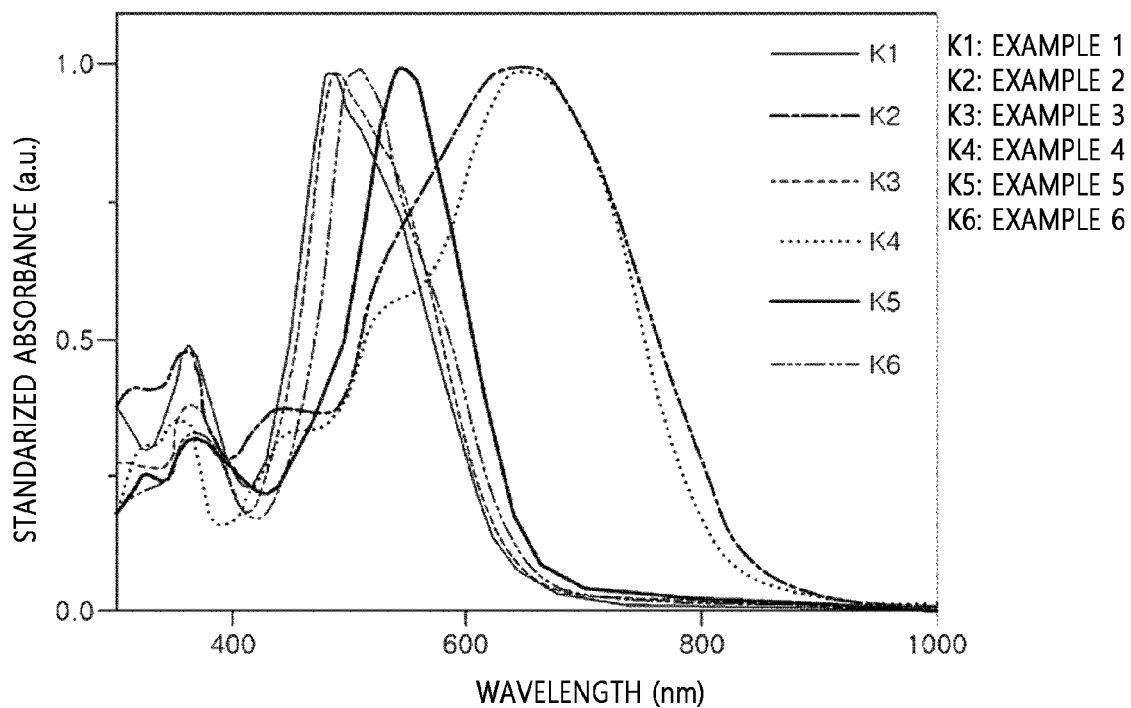
FIG. 1 is a graph illustrating UV-VIS absorption spectra of copolymers prepared according to Examples 1 to 6.

Hereinafter, the present invention will be described in detail.

The present invention relates to a copolymer represented by Formula 1 below.

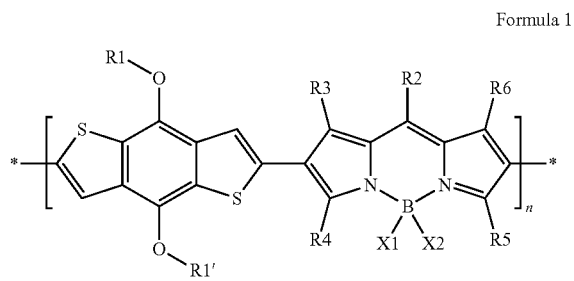

Formula 1

In Formula 1 above,

R1 and R1' are each independently a straight-chain or branched $C_4$ to $C_{30}$ alkyl group, alkenyl group, or alkynyl group, R2 is a straight-chain or branched $C_1$ to $C_{20}$ alkyl group unsubstituted or substituted with a halogen atom, or a straight-chain or branched $C_2$ to $C_{20}$ alkenyl group or alkynyl group, R3 to R6 are each independently a straight-chain or branched $C_1$ to $C_{20}$ alkyl group, or a straight-chain or branched $C_2$ to $C_{20}$ alkenyl group or alkynyl group, $X_1$ and $X_2$ are each independently a halogen atom, a repeat number n of a repeating unit is from 2 to 50, and a number average molecular weight (Mn) is from 1400 to 60000.

In particular, the number average molecular weight may have a unit of g/mol.

In an embodiment of the present invention, the R1 and R1' may be each independently a branched $C_8$ to $C_{24}$ alkyl group, and the R1 and R1' may be each independently a 2-ethylhexyl group, a 2-hexyldecyl group, or a 2-decyltetradecyl group, without being limited thereto. The R1 and R1' may be the same.

In another embodiment of the present invention, the R2 may be an unsubstituted methyl group, a methyl group substituted with a halogen atom, or a undecyl group, and the R2 may be an unsubstituted methyl group, without being limited thereto.

In still another embodiment of the present invention, the R1 and R1' may be each independently a 2-ethylhexyl group, and the R2 may be a methyl group, without being limited thereto.

In an embodiment of the present invention, the R3 to R6 may be each independently a $C_1$ to $C_{10}$ alkyl group, preferably, a $C_1$ to $C_3$ alkyl group. Further, the R3 to R6 may be the same or different, preferably the same, without being limited thereto.

In another embodiment of the present invention, the $X_1$ and $X_2$ may be the same or different, preferably both may be fluorine, without being limited thereto.

In addition, the present invention also relates to a method for preparing a copolymer represented by Formula 1 below by polymerizing a compound represented by Formula 2 below and a compound represented by Formula 3 below.

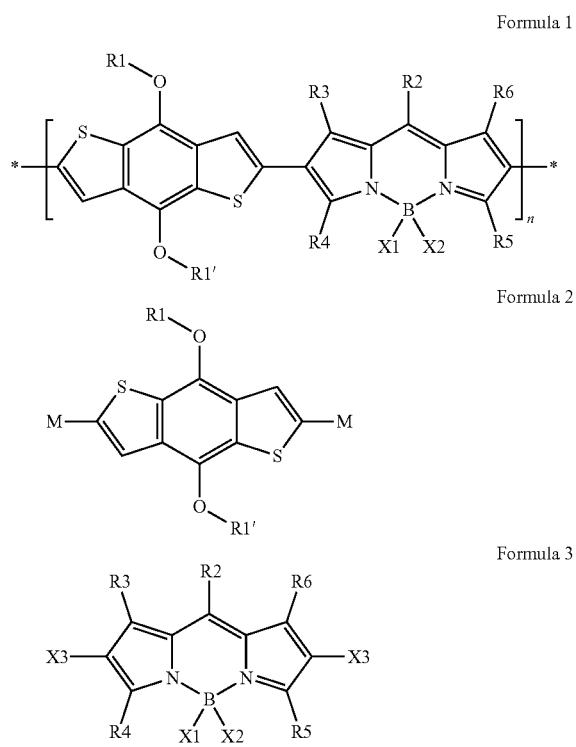

Formula 1

Formula 2

Formula 3

In the formulas above,

R1 and R1' are each independently a straight-chain or branched $C_4$ to $C_{30}$ alkyl group, alkenyl group, or alkynyl group, R2 is a straight-chain or branched $C_1$ to $C_{20}$ alkyl group unsubstituted or substituted with a halogen atom, or a straight-chain or branched $C_2$ to $C_{20}$ alkenyl group or alkynyl group, R3 to R6 are each independently a straight-chain or branched $C_1$ to $C_{20}$ alkyl group, or a straight-chain or branched $C_2$ to $C_{20}$ alkenyl group or alkynyl group, M is an organotin compound or an organoboron compound, $X_1$, $X_2$, and $X_3$ are each independently a halogen atom, a repeat number n of a repeating unit is from 2 to 50, and a number average molecular weight (Mn) is from 1400 to 60000.

In an embodiment of the present invention, the method for preparing the copolymer may include polymerization of the compound represented by Formula 2 and the compound represented by Formula 3 by SUZUKI reaction, YAMAMOTO reaction, STILLE reaction, HECK reaction, NEGISHI reaction, SONOGASHIRA reaction, HIYAMA reaction, or HARTWIG-BUCHWALD reaction, preferably, SUZUKI reaction or STILLE reaction, but the polymerization reaction is not limited thereto.

In another embodiment of the present invention, the type of the M is not limited as long as the M is an organotin compound or an organoboron compound that may be used in the reactions, and the M may preferably be $SnMe_3$ or bis(pinacolato)diboron (Bpin).

The compound represented by Formula 3 is a BODIPY-based compound. The BODIPY-based compound is a material exhibiting strong absorption in the UV/VIS region.

In an embodiment of the present invention, the R1 and R1' may be each independently a branched $C_8$ to $C_{24}$ alkyl group, and the R1 and R1' may be each independently a 2-ethylhexyl group, a 2-hexyldecyl group, or a 2-decyltetradecyl group, without being limited thereto. The R1 and R1' may be the same.

In another embodiment of the present invention, the R2 may be an unsubstituted methyl group, a methyl group substituted with a halogen atom, or a undecyl group. The R2 may be an unsubstituted methyl group, but is not limited thereto.

In still another embodiment of the present invention, the R1 and R1' may be a 2-ethylhexyl group, and the R2 may be a methyl group, without being limited thereto.

In an embodiment of the present invention, the R3 to R6 may be each independently a $C_1$ to $C_{10}$ alkyl group, preferably, a $C_1$ to $C_3$ alkyl group. In addition, the R3 to R6 may be the same or different, preferably the same, but are not limited thereto.

In another embodiment of the present invention, the $X_1$ and $X_2$ may be the same or different, preferably both may be fluorine (F), without being limited thereto.

In still another embodiment of the present invention, the $X_3$ may be preferably chlorine (Cl), without being limited thereto.

The present invention also relates to a solar cell including a copolymer represented by Formula 1 below.

Formula 1

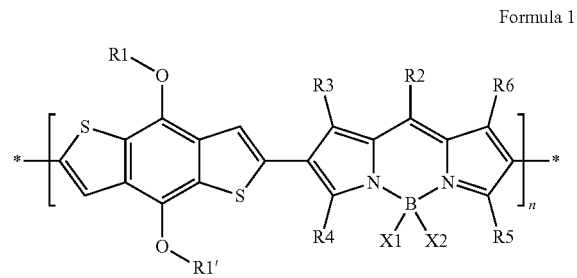

In Formula 1 above,

R1 and R1' are each independently a straight-chain or branched $C_4$ to $C_{30}$ alkyl group, alkenyl group, or alkynyl group, R2 is a straight-chain or branched $C_1$ to $C_{20}$ alkyl group unsubstituted or substituted with a halogen atom, or a straight-chain or branched $C_2$ to $C_{20}$ alkenyl group or alkynyl group, R3 to R6 are each independently a straight-chain or branched $C_1$ to $C_{20}$ alkyl group, or a straight-chain or branched $C_2$ to $C_{20}$ alkenyl group or alkynyl group, $X_1$ and $X_2$ are each independently a halogen atom, a repeat number n of a repeating unit is from 2 to 50, and a number average molecular weight (Mn) is from 1400 to 60000.

In an embodiment of the present invention, the R1 and R1' may be each independently a branched $C_8$ to $C_{24}$ alkyl group. The R1 and R1' may be each independently a 2-ethylhexyl group, a 2-hexyldecyl group, or a 2-decyltetradecyl group, without being limited thereto. The R1 and R1' may be the same.

In another embodiment of the present invention, the R2 may be an unsubstituted methyl group, a methyl group substituted with a halogen atom, or a undecyl group. The R2 may be an unsubstituted methyl group, but is not limited thereto.

In still another embodiment of the present invention, the R1 and R1' may be each independently a 2-ethylhexyl group, and the R2 may be a methyl group, without being limited thereto.

In an embodiment of the present invention, the R3 to R6 may be each independently a $C_1$ to $C_{10}$ alkyl group, preferably, a $C_1$ to $C_3$ alkyl group. In addition, the R3 to R6 may be the same or different, preferably the same, without being limited thereto.

In another embodiment of the present invention, the $X_1$ and $X_2$ may be the same or different, preferably both may be fluorine, without being limited thereto.

In another embodiment of the present invention, the solar cell may be a perovskite solar cell. Hereinafter, the solar cell of the present invention will be described using a perovskite solar cell by way of example, but the scope of the present invention is not limited thereto.

The solar cell of the present invention includes a first electrode, a light absorbing layer formed on the first electrode, a hole transporting layer formed on the light absorbing layer; and a second electrode formed on the hole transporting layer, wherein the hole transporting layer includes the copolymer represented by Formula 1.

In an embodiment of the present invention, the first electrode may be formed of fluorine tin oxide (FTO), indium tin oxide (ITO), $ZnO—Ga_2O_3$, $ZnO—Al_2O_3$, tin-based oxide, zinc oxide, or etc., preferably, FTO.

In another embodiment of the present invention, the light absorbing layer may include a metal oxide and a compound having a perovskite structure.

The compound having a perovskite structure may include at least one selected from $CH_3NH_3PbI_{3-x}Cl_x$ (where x is a real number satisfying 0≤x≤3), $CH_3NH_3PbI_{3-x}Cl_x$ (where x is a real number satisfying 0≤x≤3), $H_3NH_3PbI_{3-x}Cl_x$ (where x is a real number satisfying 0≤x≤3), $CH_3NH_3PbI_{3-x}Br_x$ (where x is a real number satisfying 0≤x≤3), $CH_3NH_3PbCl_{3-x}Br_x$ (where x is a real number satisfying 0≤x≤3), and $CH_3NH_3PbI_{3-x}F_x$ (where x is a real number satisfying 0≤x≤3), without being limited thereto.

In addition, the metal oxide may be an oxide of at least one metal selected from titanium, aluminum, tin, zinc, tungsten, zirconium, gallium, indium, yttrium, niobium, tantalum, and vanadium, without being limited thereto.

The solar cell may further include a substrate on one surface of the first electrode opposite to the other surface which is in contact with the light absorbing layer, and the substrate may be a glass substrate, a conductive transparent substrate, or a plastic substrate, without being limited thereto.

The second electrode may be formed of Ag, Au, Pt, Ni, Cu, In, Ru, Pd, Rh, Ir, Os, C, a conductive polymer, or etc, preferably, Ag or Au.

In the solar cell according to an embodiment of the present invention, a P value represented by Equation 1 below may be in the range of 0.8 to 1.

$$P=PCE_{10}/PCE_o \qquad \text{Equation 1}$$

In Equation 1 above, $PCE_{10}$ is a power conversion efficiency measured at 10 days after the solar cell is manufactured, and $PCE_o$ is an initial power conversion efficiency measured at the manufacture of the solar cell. The PCE may be measured by any method commonly applied to solar cells.

The present invention also relates to a composition for forming a hole transporting layer of a solar cell including a copolymer represented by Formula 1 below.

Formula 1

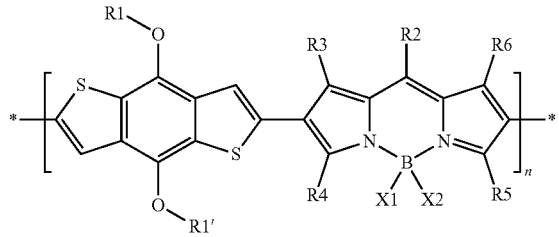

In Formula 1 above,

R1 and R1' are each independently a straight-chain or branched $C_4$ to $C_{30}$ alkyl group, alkenyl group, or alkynyl group, R2 is a straight-chain or branched $C_1$ to $C_{20}$ alkyl group unsubstituted or substituted with a halogen atom, or a straight-chain or branched $C_2$ to $C_{20}$ alkenyl group or alkynyl group, R3 to R6 are each independently a straight-chain or branched $C_1$ to $C_{20}$ alkyl group, or a straight-chain or branched $C_2$ to $C_{20}$ alkenyl group or alkynyl group, $X_1$ and $X_2$ are each independently a halogen atom, a repeat number n of a repeating unit is from 2 to 50, and a number average molecular weight (Mn) is from 1400 to 60000.

In an embodiment of the present invention, the R1 and R1' may be each independently a branched $C_8$ to $C_{24}$ alkyl group. The R1 and R1' may be each independently a 2-ethylhexyl group, a 2-hexyldecyl group, or a 2-decyltetradecyl group, without being limited thereto. The R1 and R1' may be the same.

In another embodiment of the present invention, the R2 may be an unsubstituted methyl group, a methyl group substituted with a halogen atom, or a undecyl group, preferably, an unsubstituted methyl group, without being limited thereto.

In still another embodiment of the present invention, the R1 and R1' may be a 2-ethylhexyl group, and the R2 may be a methyl group, without being limited thereto.

In an embodiment of the present invention, the R3 to R6 may be each independently a $C_1$ to $C_{10}$ alkyl group, preferably, a $C_1$ to $C_3$ alkyl group. In addition, the R3 to R6 may be the same or different, preferably the same, without being limited thereto.

In another embodiment of the present invention, the $X_1$ and $X_2$ may be the same or different, preferably both may be fluorine, without being limited thereto.

Hereinafter, preferred examples are provided to help the understanding of the present invention. However, these examples are for illustrative purposes only. It will be apparent to those skilled in the art that various changes and modifications are possible within the scope and technical idea of the present invention and that such changes and modifications belong to the scope of the enclosed claim set.

EXAMPLES

Copolymers were prepared by STILLE reaction according to Examples 1, 2, and 4 to 6, and a copolymer was prepared by SUZUKI reaction according to Example 3.

Exampled 1, 2 and 4 to 6: Preparation of Copolymer 5 mg of tris(dibenzylideneacetone)dipalladium(0) (5.4 μmol, 3 mol %) and 13 mg of tri(o-tolyl)phosphine) (43 μmol, 24 mol %) were added to a dried reactor in a glove box under a nitrogen atmosphere. Separately, 139 mg of a benzodithiophene distannane ((4,8-bis((2-ethylhexyl)oxy) benzo[1,2-b:4,5-b']dithiophene-2,6-diyl)bis(trimethylstannane), 0.18 mmol) and 92 mg of a diodized BODIPY compound (5,5-difluoro-2,8-diiodo-1,3,7,9,10-pentamethyl-5H-4$\lambda^4$,5$\lambda^4$-dipyrrolo [1,2-c:2',1'-f][1,3,2]diazaborinine, 0.18 mmol) were slowly mixed with 10 mL of toluene from which moisture and oxygen were removed under an argon atmosphere. Then, the reaction solution was heated for 16 hours until a solvent was refluxed. After the heating, the reaction solution was cooled to room temperature and added to methanol for precipitation. A precipitate was filtered using a filter, and a filtrate was purified by Soxhlet extraction by sequentially using methanol, hexane, and chloroform. Then, chloroform fractions were concentrated under a reduced pressure. A concentrate was dried under a reduced pressure to obtain 39 mg of a copolymer in the form of a red solid (yield: 31%).

Copolymers according to Examples 2, and 4 to 6 were prepared in the same manner as in Example 1, except that different conditions (starting material, catalyst, ligand, and reaction time) listed in Tables 1 and 2 below were applied thereto.

Example 3: Preparation of Copolymer

A copolymer according to Example 3 was prepared in the same manner as in Example 1, except that different conditions (starting material, catalyst, ligand, and reaction time) listed in Tables 1 and 2 below were applied thereto, and SUZUKI reaction, instead of STILLE reaction, was performed.

Meanwhile, specific reaction schemes and products obtained in the preparation of the copolymers according to Examples 1 to 6 are shown in Table 1, and specific starting materials, catalysts, ligands, and reaction times are shown in Table 2 below.

TABLE 1

| Example | Specific reaction scheme and product |
|---|---|
| Example 1 | 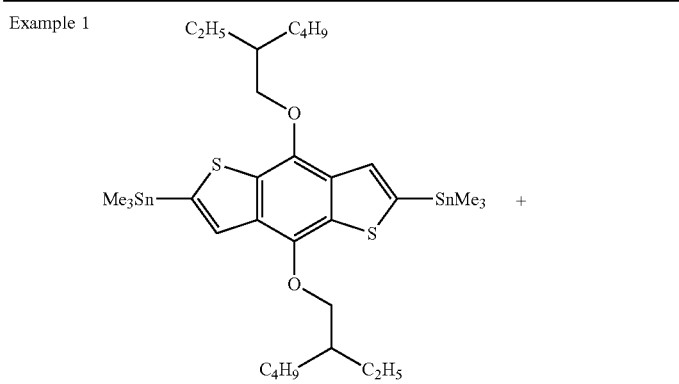 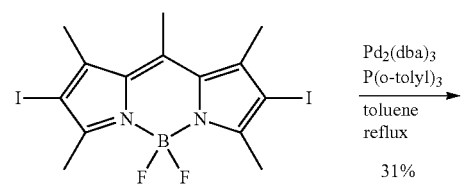 |

TABLE 1-continued
| Example | Specific reaction scheme and product |
|---|---|
| | 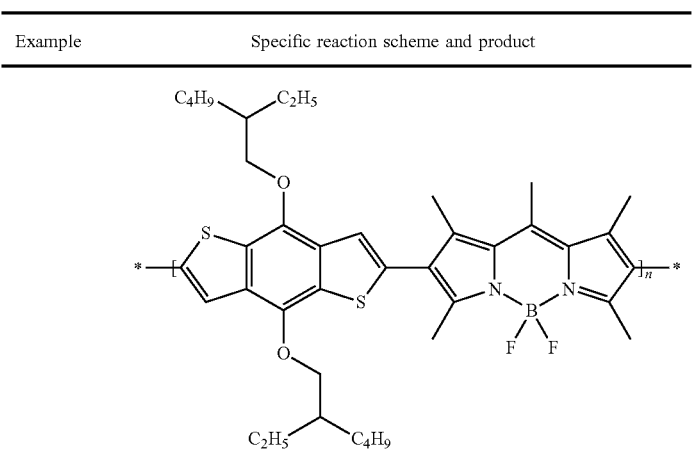
K1 |
| Example 2 | 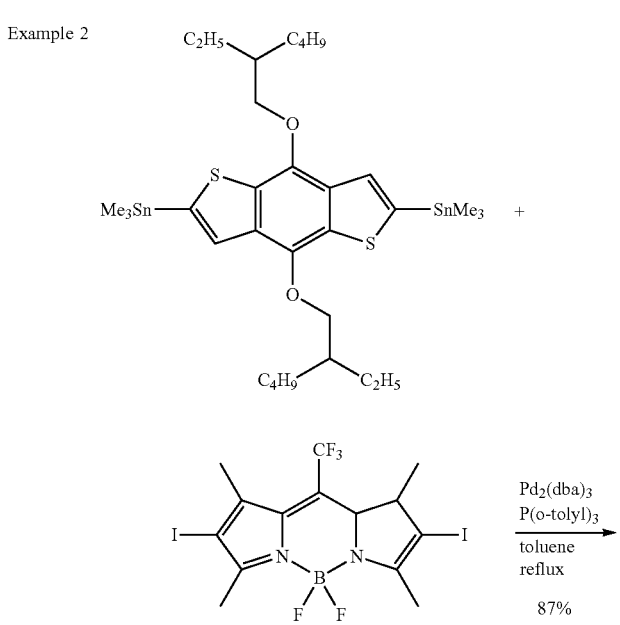 |
| | 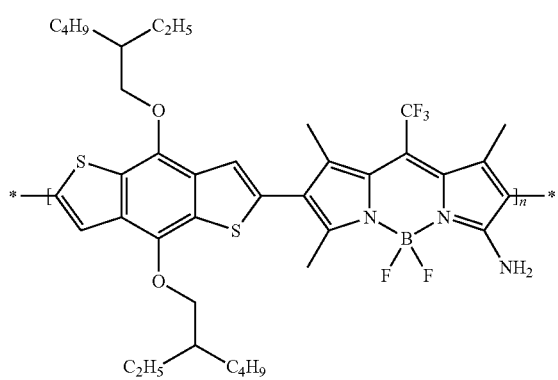
K2 |

TABLE 1-continued
| Example | Specific reaction scheme and product |
|---|---|
| Example 3 | 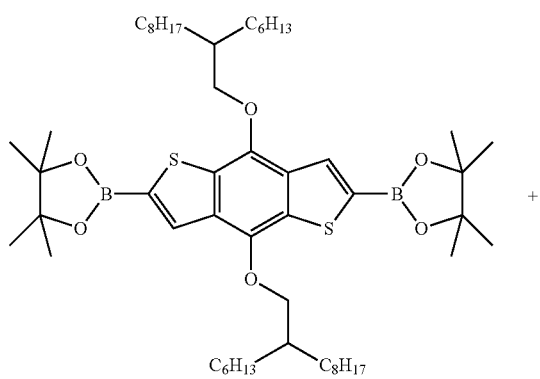 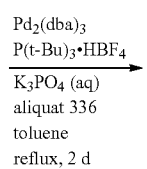 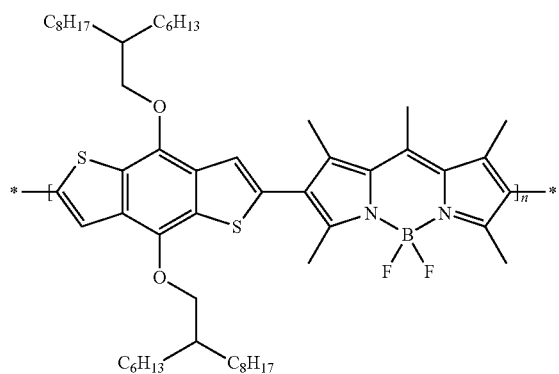 K3 |
| Example 4 | 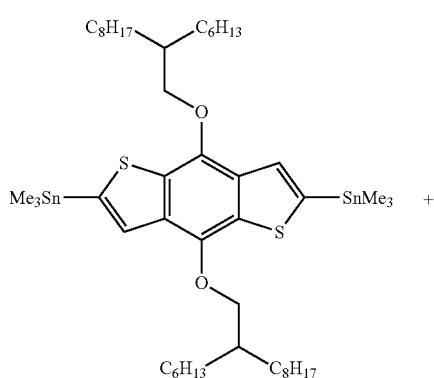 |

TABLE 1-continued
| Example | Specific reaction scheme and product |
| --- | --- |
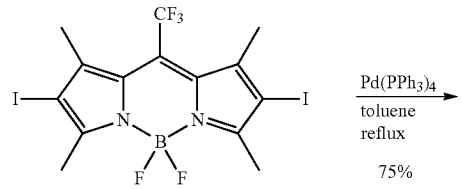
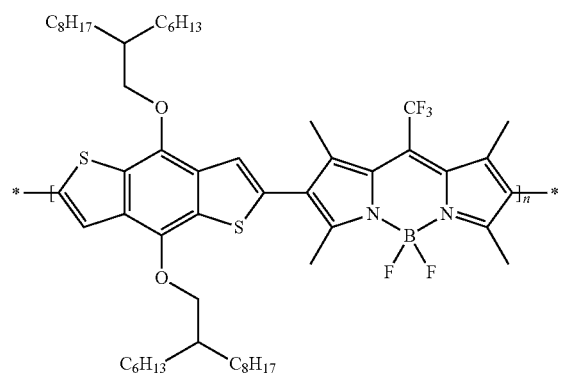
K4
Example 5
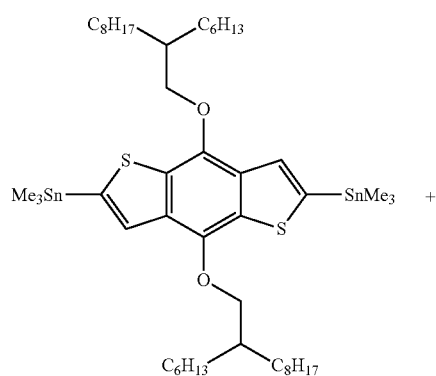
+
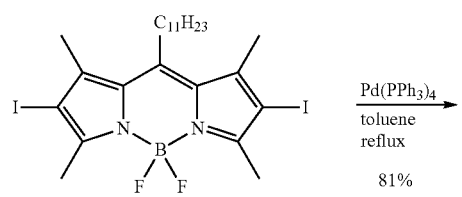

TABLE 1-continued
| Example | Specific reaction scheme and product |
|---|---|
| Example 6 | 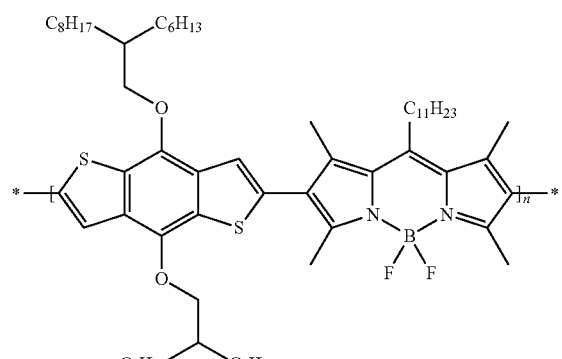 |
Terms used in the reaction schemes:
Pd$_2$(dba$_3$): tris(dibenzylideneacetone)dipalladium(0)
P(o-tolyl)$_3$: tri(o-tolyl)phosphine)
P($^t$Bu)$_3$·HBF$_4$: tri-tert-butylphosphonium tetrafluoroborate
Pd(PPh$_3$)$_4$: tetrakis(triphenylphosphine)palladium(0)

TABLE 2

| Example and Palladium catalyst and ligand | Type of benzodithiophene | Type of BODIPY | Reaction time |
|---|---|---|---|
| Example 1: Pd₂(dba)₃ (5 mg, 5.4 μmol, 3 mol %) P(o-tolyl)₃ (13 mg, 43 μmol, 24 mol %) | 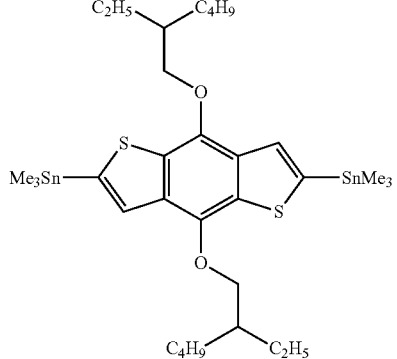<br>(4,8-bis((2-ethylhexyl)oxy)benzo[1,2-b:4,5-b']dithiophene-2,6-diyl)bis(trimethylstannane) | (5,5-difluoro-2,8-diiodo-1,3,7,9,10-pentamethyl-5H-4λ⁴,5λ⁴-dipyrrolo[1,2-c:2',1'-f][1,3,2]diazaborinine) | 16 hours |
| Example 2: Pd₂(dba)₃ (6 mg, 6.6 μmol, 3 mol %), P(o-tolyl)₃ (16 mg, 52 μmol, 24 mol %) | 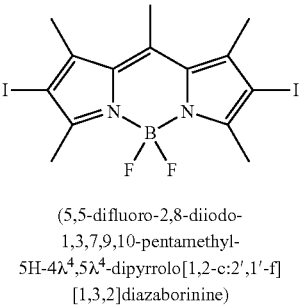<br>(4,8-bis((2-ethylhexyl)oxy)benzo[1,2-b:4,5-b']dithiophene-2,6-diyl)bis(trimethylstannane) | (5,5-difluoro-2,8-diiodo-1,3,7,9-tetramethyl-10-(trifluoromethyl)-5H-4λ⁴,5λ⁴-dipyrrolo[1,2-c:2',1'-f][1,3,2]diazaborinine) | 16 hours |
| Example 3: Pd₂(dba)₃ (6 mg, 7.0 μmol, 5 mol %), P(ᵗBu)₃·HBF₄ (4 mg, 130 μmol, 10 mol %) Additionally, a 0.5 M K₃PO₄ aqueous solution (2 mL) and 2 droplets of Aliquat 366 were used. | 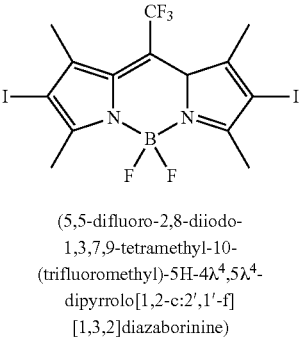<br>2,2'-(4,8-bis((2-hexyldecyl)oxy)benzo[1,2-b:4,5-b']dithiophene-2,6-diyl)bis(4,4,5,5-tetramethyl-1,3,2-dioxaborolane | (5,5-difluoro-2,8-diiodo-1,3,7,9,10-pentamethyl-5H-4λ⁴,5λ⁴-dipyrrolo[1,2-c:2',1'-f][1,3,2]diazaborinine) | 2 days |

TABLE 2-continued

| Example and Palladium catalyst and ligand | Type of benzodithiophene | Type of BODIPY | Reaction time |
|---|---|---|---|
| Example 4 | Pd(PPh₃)₄ (5 mg, 4.2 μmol, 3 mol %) | 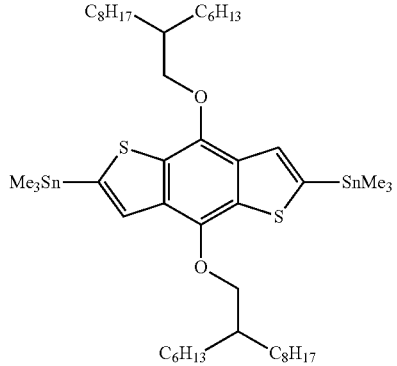<br>(4,8-bis((2-hexyldecyl)oxy)benzo[1,2-b:4,5-b']dithiophene-2,6-diyl)bis(trimethylstannane) | 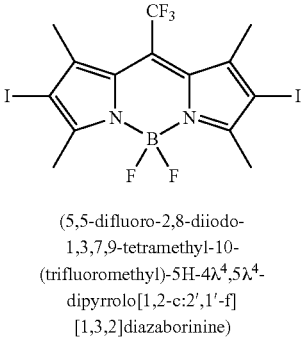<br>(5,5-difluoro-2,8-diiodo-1,3,7,9-tetramethyl-10-(trifluoromethyl)-5H-4λ⁴,5λ⁴-dipyrrolo[1,2-c:2',1'-f][1,3,2]diazaborinine) | 2 days |
| Example 5 | Pd(PPh₃)₄ (6 mg, 5.4 μmol, 3 mol %) | 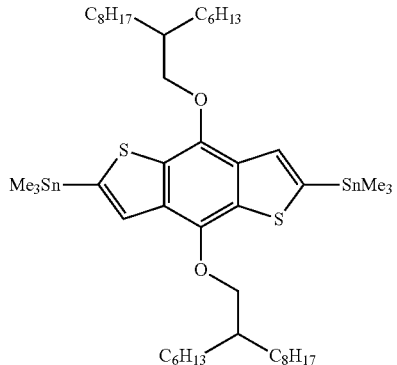<br>(4,8-bis((2-hexyldecyl)oxy)benzo[1,2-b:4,5-b']dithiophene-2,6-diyl)bis(trimethylstannane) | 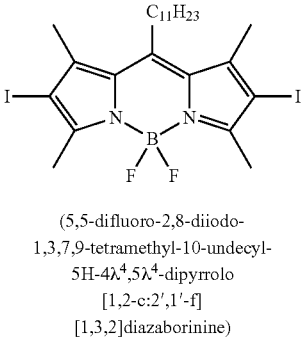<br>(5,5-difluoro-2,8-diiodo-1,3,7,9-tetramethyl-10-undecyl-5H-4λ⁴,5λ⁴-dipyrrolo[1,2-c:2',1'-f][1,3,2]diazaborinine) | 2 days |
| Example 6 | Pd(PPh₃)₄ (6 mg, 5.4 μmol, 3 mol %) | 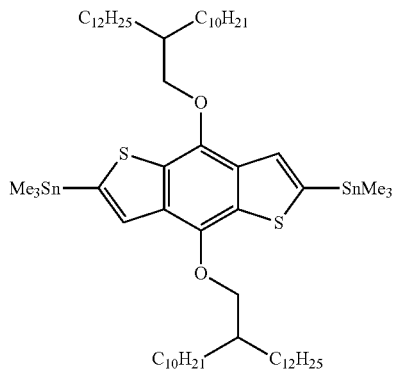<br>(4,8-bis((2-decyltetradecyl)oxy)benzo[1,2-b:4,5-b']dithiophene-2,6-diyl)bis(trimethylstannane) | 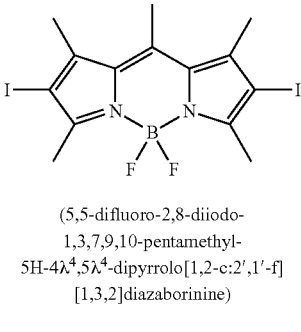<br>(5,5-difluoro-2,8-diiodo-1,3,7,9,10-pentamethyl-5H-4λ⁴,5λ⁴-dipyrrolo[1,2-c:2',1'-f][1,3,2]diazaborinine) | 2 days |

The yields and NMR analysis results of the copolymers prepared according to Examples 1 to 6 are shown in Table 3 below.

TABLE 3

| Example | Yield | NMR analysis result |
| --- | --- | --- |
| Example 1 | 31% | $^1$H NMR (400 MHz, CDCl$_3$, δ): 7.54 (s, 2H), 7.30 (s, 4H), 7.27 (s, 2H), 4.24 (br, 20H), 2.78 (br, 10H), 2.68 (br, 22H), 2.55 (br, 22H), 1.82 (br, 8H), 1.40 (br, 44H), 1.02 (br, 28H), 0.94 (br, 32H) |
| Example 2 | 87% | $^1$H NMR (400 MHz, CDCl$_3$, δ): 7.35 (s, 2H), 4.24 (br, 4H), 2.72 (br, 6H), 2.42 (br, 6H), 1.84 (br, 2H), 1.40 (br, 12H), 1.04 (br, 16H). $^{19}$F NMR (376 Hz, CDCl$_3$, δ): −51.6, −145.4 |
| Example 3 | 85% | $^1$H NMR (400 MHz, CDCl$_3$, δ): 7.29 (s, 2H), 4.23 (br, 4H), 2.78 (br, 2H), 2.69 (br, 5H), 2.55 (br, 4H), 1.87 (br, 2H), 1.63 (br, 4H), 1.25 (br, 48H), 0.88 (br, 12H) |
| Example 4 | 75% | $^1$H NMR (400 MHz, CDCl$_3$, δ): 7.35 (s, 2H), 4.24 (br, 4H), 2.73 (br, 6H), 2.42 (br, 6H), 1.89 (br, 2H), 1.64 (br, 4H), 1.31 (br, 42H), 0.87 (br, 12H). $^{19}$F NMR (376 Hz, CDCl$_3$, δ): −51.7, −145.4 |
| Example 5 | 81% | $^1$H NMR (400 MHz, CDCl$_3$, δ): 7.31 (s, 2H), 4.24 (br, 4H), 2.68 (br, 6H), 2.55 (br, 6H), 1.90 (br, 2H), 1.65 (br, 4H), 1.25 (br, 62H), 0.87 (br, 15H) |
| Example 6 | 94% | $^1$H NMR (400 MHz, CDCl$_3$, δ): 7.29 (s, 2H), 4.24 (br, 4H), 2.69 (br, 6H), 2.55 (br, 6H), 1.89 (br, 2H), 1.63 (br, 3H), 1.25 (br, 80H), 0.86 (br, 12H) |

Mn, Mw, and PDI of the copolymers prepared according to Examples 1 to 6 are shown in Table 4 below.

TABLE 4

| Example | Mn | Mw | PDI* |
| --- | --- | --- | --- |
| Example 1 | 3500 | 4500 | 1.29 |
| Example 2 | 8300 | 14800 | 1.78 |
| Eumple 3 | 6400 | 8300 | 1.30 |
| Example 4 | 12400 | 21900 | 1.77 |
| Example 5 | 47900 | 106200 | 2.22 |
| Example 6 | 20300 | 68100 | 3.35 |

PDI*: value calculated by Mw/Mn

Comparative Example 1:
Poly(3,4-ethylenedioxythiophene)polystyrene sulfonate (PEDOT:PSS)

PEDOT:PSS (CLEVIOS™ P VP AI 408) was purchased from Heraeus.

Preparation Example 1: Manufacture of Solar Cell

An ITO glass substrate was washed with a detergent, acetone, and isopropyl alcohol (IPA). Then, the ITO glass substrate was surface-treated with UV-ozone and a solution prepared by dissolving the copolymer prepared in Example 1 in chlorobenzene at a concentration of 0.25 wt % was spin-coated thereon at 5000 rpm for 20 seconds. After the spin-coating, the resultant was heat-treated at 80° C. for 10 minutes to form a thin hole transporting layer having a thickness of about 10 nm.

Then, a solution prepared by dissolving poly[(9,9-bis 3'-(N,N-dimethylamino)propyl)-2,7-fluorene)-alt-2,7-(9,9-dioctylfluorene)] (PFN) in methanol at a concentration of 0.1 wt % was spin-coated at 5000 rpm for 20 seconds to form a PFN layer.

Subsequently, 692 mg of PbI$_2$ and 238 mg of CH$_3$NH$_3$I$_3$ were mixed in a molar ratio of 1:1 in 1 mL of dimethyl formamide (DMF) to prepare a perovskite precursor solution (CH$_3$NH$_3$PbI$_{3-x}$Cl$_x$, where x is a real number satisfying 0≤x≤3). Then, the prepared perovskite precursor solution was spin-coated on the ITO glass substrate on which the hole transporting layer and the PFN layer were formed at 5000 rpm for 40 seconds, and then the spin-coating was further performed for 10 seconds after 1 mL of diethylether was dropped on the rotating ITO glass substrate. After the spin-coating, the resultant was further heated at 100° C. for 10 minutes to form a perovskite layer.

Subsequently, a solution prepared by dissolving phenyl-C61-butyric acid methyl ester (PCBM) in chlorobenzene at a concentration of 40 mg/mL was spin-coated on the perovskite layer at 2000 rpm for 20 seconds to form a PCBM layer.

Figure 10:
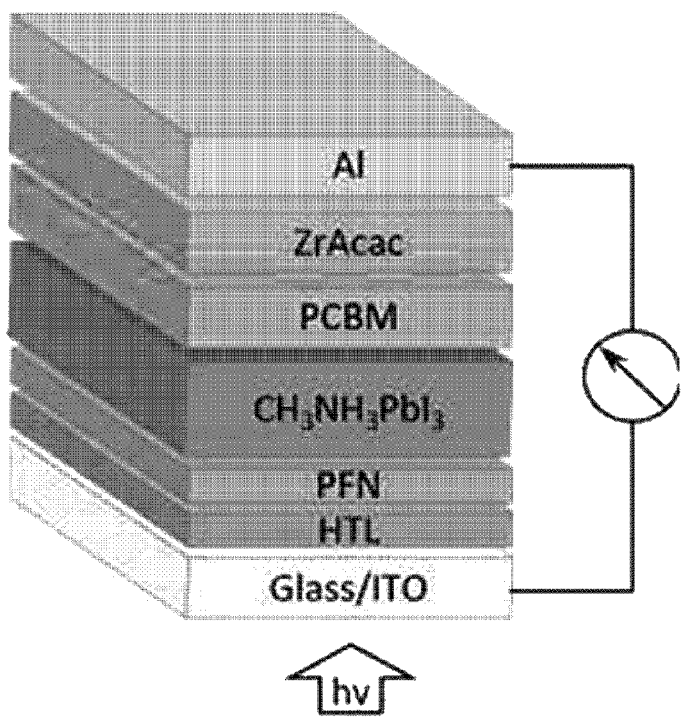
FIG. 10 is a schematic diagram of the solar cell prepared according to Preparation Example 1.

Finally, a solution prepared by dissolving zirconium acetylacetonate (ZrAcac) in methanol at a concentration of 1 mg/mL was spin-coated on the PCBM layer at 5000 rpm for 20 seconds, and an aluminum (Al) electrode having a thickness of 100 nm was deposited thereon to prepare a perovskite solar cell as shown in FIG. 10.

Preparation Examples 2 to 6: Manufacture of Solar Cell

Solar cells were manufactured in the same manner as in Preparation Example 1, except that the copolymers prepared according to Examples 2 to 6 were used, respectively, instead of the copolymer prepared according to Example 1.

Comparative Preparation Example 1: Manufacture of Solar Cell

A solar cell was manufactured in the same manner as in Preparation Example 1, except that PEDOT:PSS of Comparative Example 1 was used instead of the copolymer of Example 1.

EXPERIMENTAL EXAMPLES

Experimental Example 1: Measurement of UV-VIS Absorption Spectrum of Copolymer

A solution prepared by dissolving each of the copolymers prepared according to Examples 1 to 6 in chloroform at a concentration of 3 mg/mL was spin-coated onto a washed glass substrate at 1200 rpm for 20 seconds to form a film, and the film was further heated at 100° C. for 10 minutes.

After the heat-treatment, UV-VIS absorption spectra thereof were obtained, and the results are shown in FIG. 1. The UV-VIS absorption spectra were obtained by using a Perkin Elmer Lambda 750.

Experimental Example 2: Electrochemical Analysis

Figure 2:
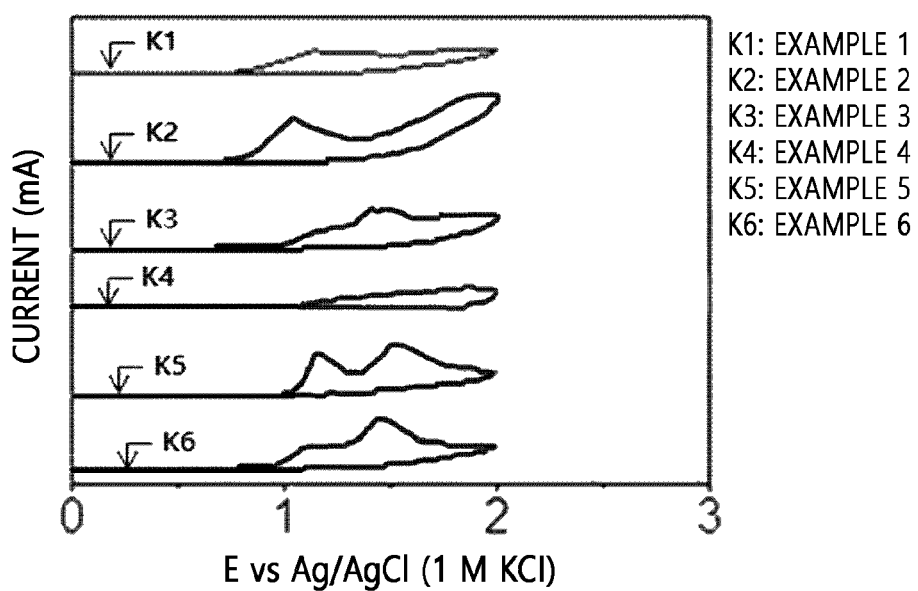
FIG. 2 is a graph illustrating electrochemical analysis results of the copolymers prepared according to Examples 1 to 6.

Through electrochemical analysis of each of the copolymers prepared according to Examples 1 to 6, oxidation potential and onset potential of oxidation were obtained, and the results are shown in FIG. 2. The highest occupied molecular orbital (HOMO) values were calculated using the onset potential of oxidation.

Figure 3:
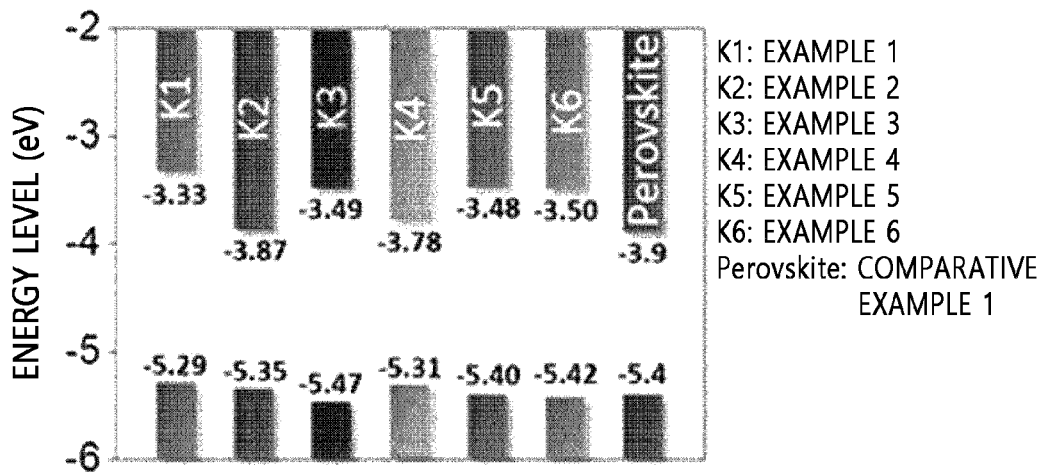
FIG. 3 is a graph illustrating energy level matching results of the copolymers prepared according to Examples 1 to 6 and a copolymer of Comparative Example 1.

Experimental Example 3: Energy Level Matching of Hole Transporting Material of Solar Cell Bandgaps obtained from the UV-VIS spectra according to Experimental Example 1 and HOMO values obtained from the electrochemical analysis according to Experimental Example 2 are shown in FIG. 3. For example, the copolymer prepared according to Example 1 had a HOMO value of −5.29 eV, a bandgap value of 1.96 eV, and the lowest unoccupied molecular orbital (LUMO) value of −3.33 eV.

Experimental Example 4: Performance Test of Solar Cell

Figure 4:
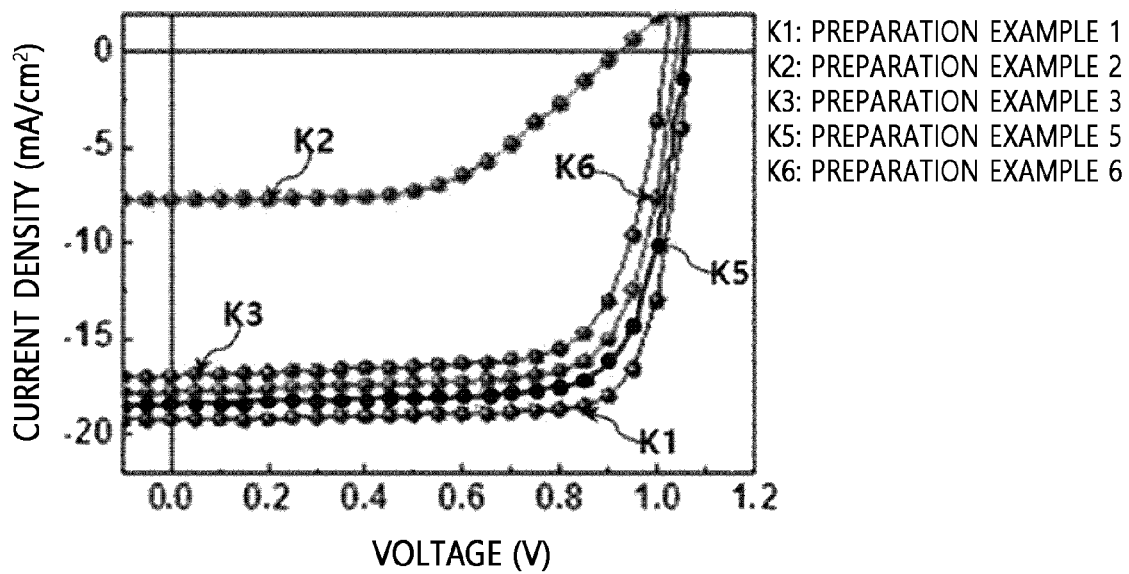
FIG. 4 a graph illustrating J-V curves of solar cells prepared according to Preparation Examples 1 to 3, 5, and 6.
Figure 11:
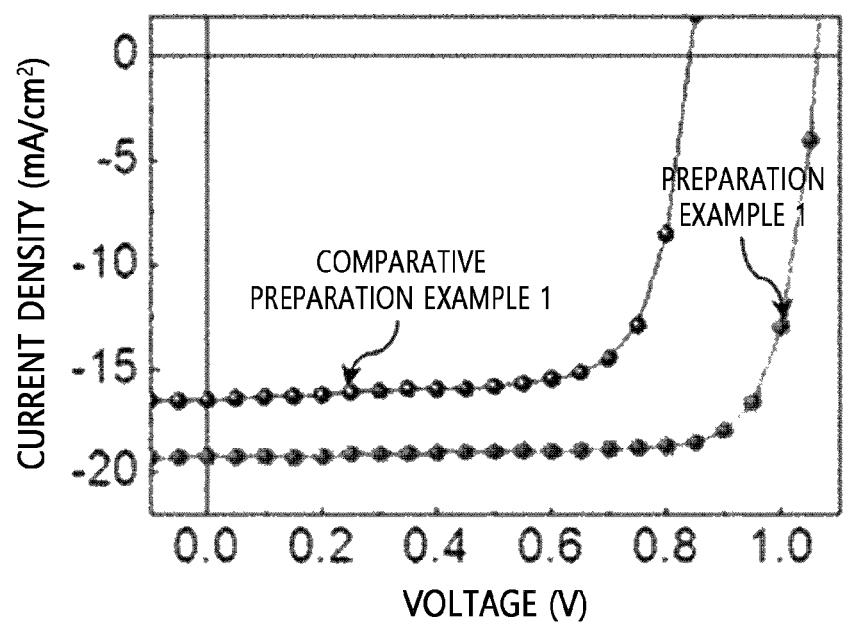
FIG. 11 is a graph illustrating J-V curves of the solar cells prepared according to Preparation Example 1 and Comparative Preparation Example 1.

Photovoltaic parameters of the solar cells manufactured according to Preparation Examples 1 to 3, 5, and 6 and Comparative Preparation Example 1 were measured and shown in Table 3 below, and current density (J)-voltage (V) curves of the solar cells manufactured according to Preparation Examples 1 to 3, 5, and 6 are shown in FIG. 4. In addition, J-V curves of the solar cells manufactured according to Preparation Example 1 and Comparative Preparation Example 1 are shown in FIG. 11.

The J-V curve is a graph obtained by measuring current density by scanning each of the prepared solar cells with a Keithley 236 Source Measure Unit (SMU) using an air mass 1.5 Global (AM 1.5 G) at an intensity of 100 mW/cm² and at a scan rate of 100 mV/s.

In Table 5 below, Fill Factor (FF) refers to a ratio of a theoretical maximum power to a measured maximum power on the J-V curve, and power conversion efficiency (PCE, η) was calculated by using the following equation.

$$\eta = \frac{P_{max}}{P_{input}} = \frac{I_{mp} \cdot V_{mp}}{P_{input}} = \frac{V_{oc} \cdot I_{sc}}{P_{input}} \cdot FF, [\%]$$

(where $P_{input}$ is a power of incident sunlight and $P_{max}$ is a measured maximum power output).

TABLE 5

| Example | $V_{OC}$ (V) | $J_{SC}$ (mA/cm²) | FF | PCE (%) |
| --- | --- | --- | --- | --- |
| Preparation Example 1 | 1.06 | 19.22 | 0.78 | 16.02 |
| Preparation Example 2 | 0.92 | 7.69 | 0.55 | 3.85 |
| Preparation Example 3 | 1.02 | 16.94 | 0.73 | 12.50 |
| Preparation Example 5 | 1.05 | 18.32 | 0.76 | 14.65 |
| Preparation Example 6 | 1.04 | 17.75 | 0.75 | 13.77 |
| Comparative Preparation Example 1 | 0.84 | 16.48 | 0.73 | 10.12 |

Figure 5:
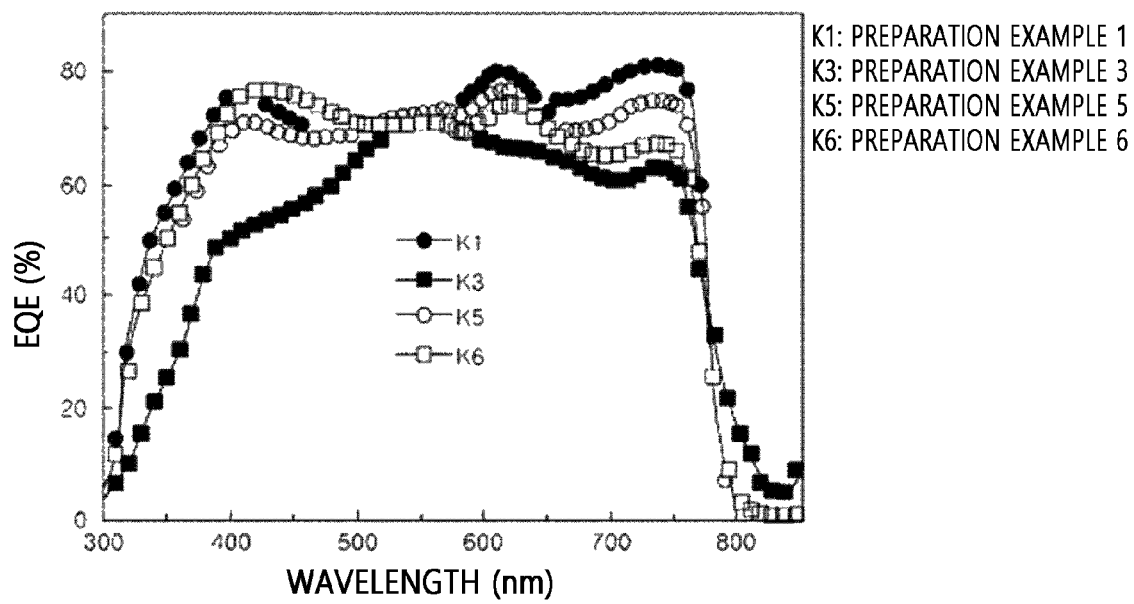
FIG. 5 is a graph illustrating external quantum efficiencies of the solar cells prepared according to Preparation Examples 1, 3, 5, and 6.
Figure 6:
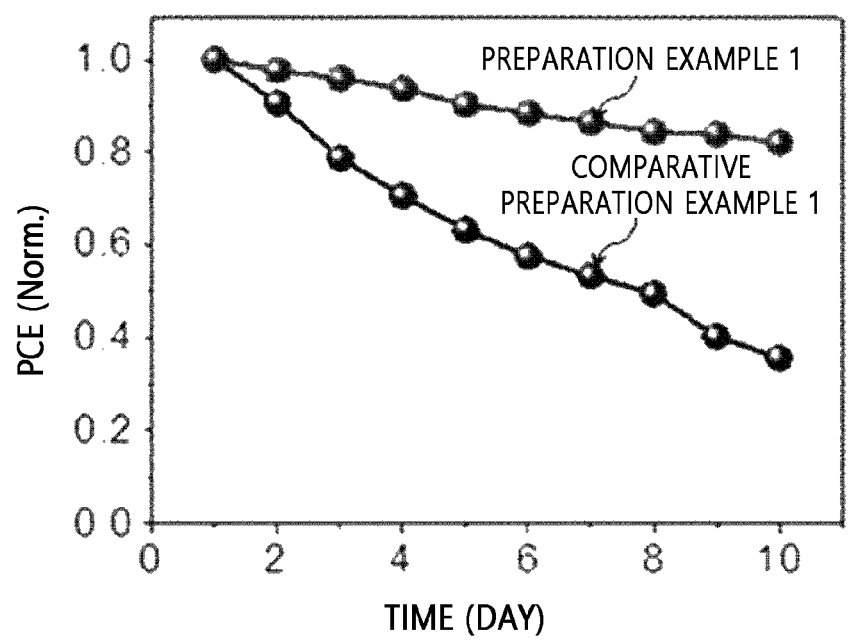
FIGS. 6 to 9 are graphs illustrating stability test results of the solar cell prepared according to Preparation Example 1 and a solar cell prepared according to Comparative Preparation Example 1.
Figure 7:
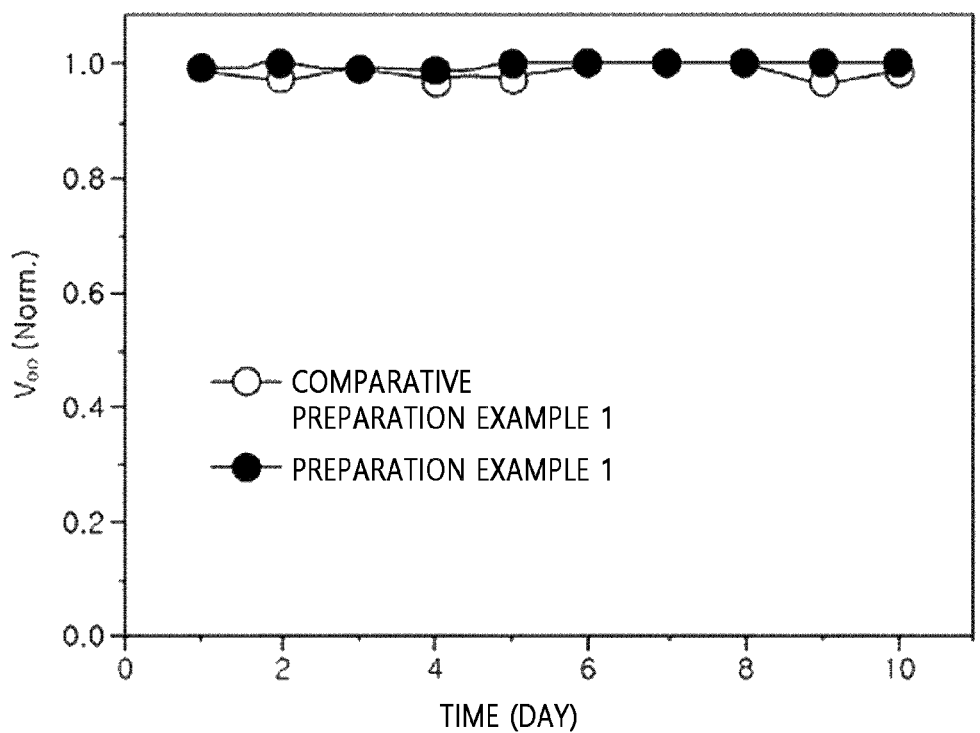
Figure 8:
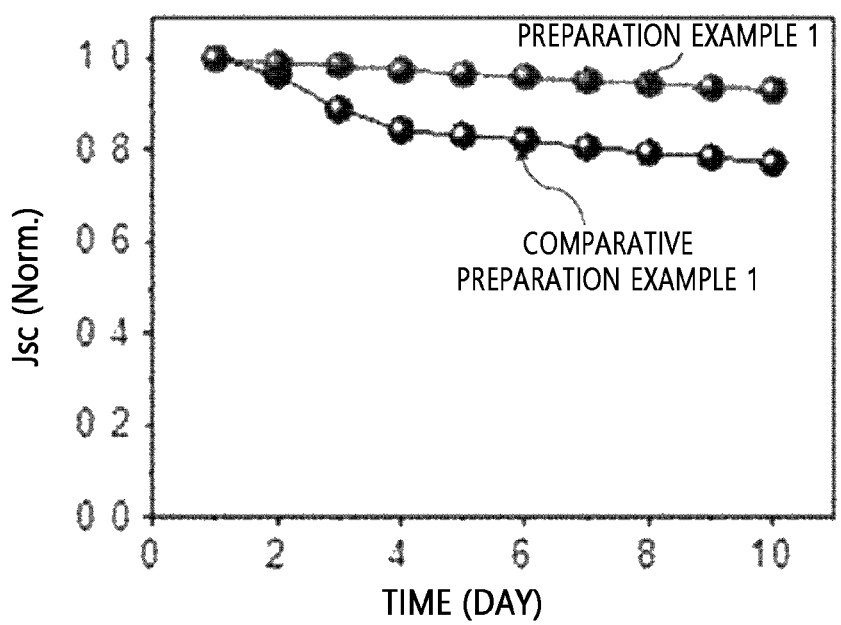
Figure 9:
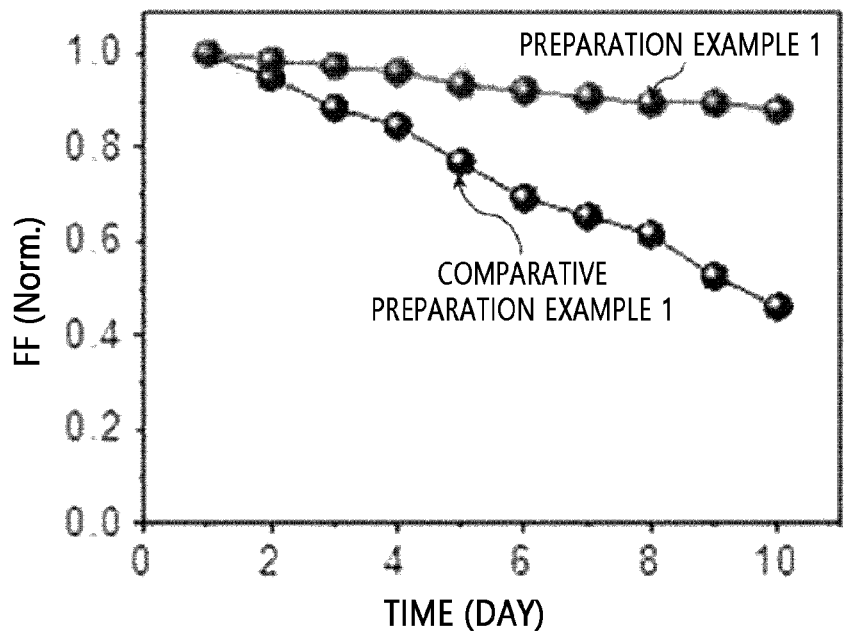

Experimental Example 5: Measurement of External Quantum Efficiency of Solar Cell External quantum efficiency (EQE (%), an efficiency value of converting photons into charged particles by light having a wavelength of the visible light region) of each of the solar cells prepared according to Preparation Examples 1, 3, 5, and 6 was measured, and the results are shown in FIG. 5. In the measurement of external quantum efficiency, a solar cell spectral response/quantum efficiency (QE)/EQE measurement system (PV Measurements, Inc.) was used.

Experimental Example 6: Stability Test of Solar Cell

Stability of each of the solar cells manufactured according to Preparation Example 1 and Comparative Preparation Example 1 was tested, and the results are shown in FIGS. 6 to 9.

Referring to FIGS. 6 to 9, the PCE of the solar cells prepared according to Comparative Preparation Example 1 rapidly decreased with time. After 10 days, the PCE decreased to 40% of an initial PCE. However, the PCE of the solar cell manufactured according to Preparation Example 1 was maintained at about 80% of an initial PCE even after 10 days. Based on these results, it was confirmed that the solar cell manufactured according to Preparation Example 1 had better stability than the solar cell manufactured according to Comparative Preparation Example 1.

According to the experimental examples described above, it was confirmed that the novel copolymer according to the present invention exhibited excellent stability as well as high power conversion efficiency.

The invention claimed is:
1. A copolymer represented by Formula 1 below:

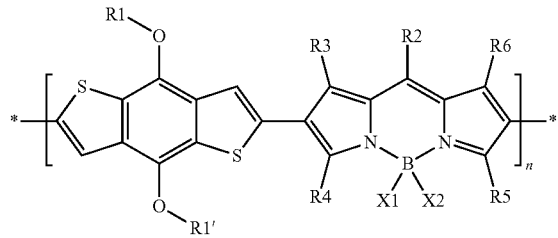

Formula 1 wherein in Formula 1 above,
R1 and R1' are each independently selected from the group consisting of a straight-chain or branched $C_4$ to $C_{30}$ alkyl group, alkenyl group, and alkynyl group,
R2 is selected from the group consisting of a straight-chain or branched $C_1$ to $C_{20}$ alkyl group unsubstituted or substituted with a halogen atom, and a straight-chain or branched $C_2$ to $C_{20}$ alkenyl group or alkynyl group,
R3 to R6 are each independently selected from the group consisting of a straight-chain or branched $C_1$ to $C_{20}$ alkyl group, and a straight-chain or branched $C_2$ to $C_{20}$ alkenyl group or alkynyl group,
$X_1$ and $X_2$ are each independently a halogen atom,
a repeat number n of a repeating unit is from 2 to 50, and a number average molecular weight (Mn) is from 1400 to 60000,
wherein the R1 and R1' are each independently a branched $C_8$ to $C_{24}$ alkyl group, and wherein the copolymer represented by Formula 1 comprises at least one polymer selected from the group consisting of K1 to K6:

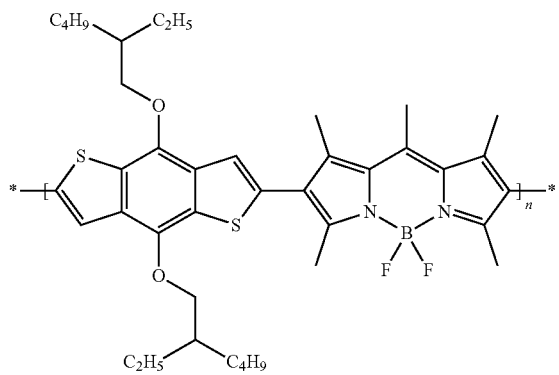

K1

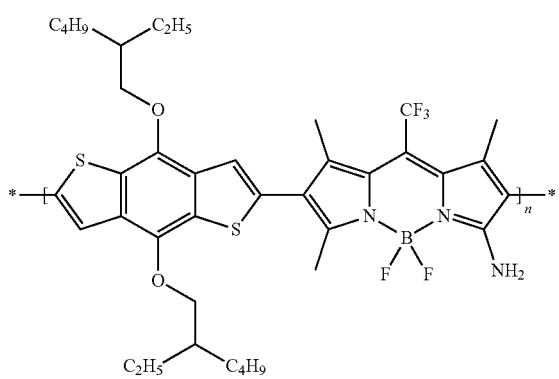

K2

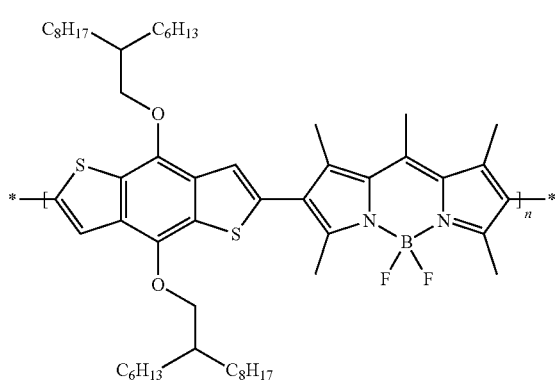

K3

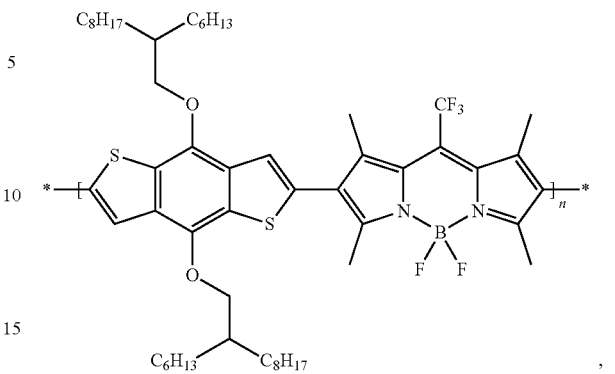

K4

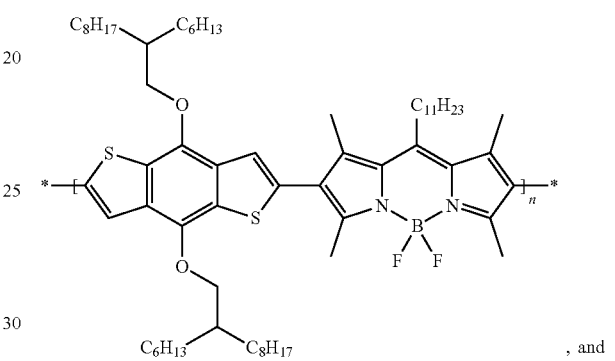

K5

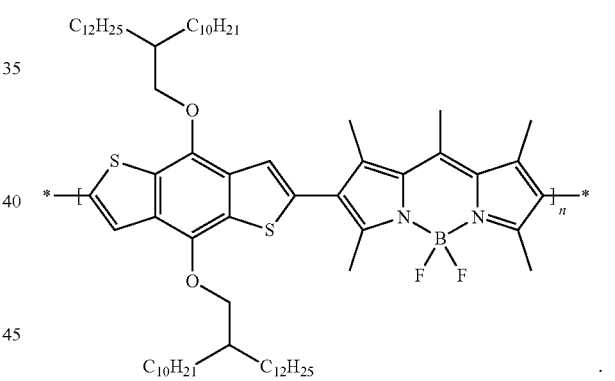

, and

K6

2. The copolymer of claim 1, wherein the R1 and R1' are each independently selected from the group consisting of a 2-ethylhexyl group, a 2-hexyldecyl group, and a 2-decyltetradecyl group.

3. The copolymer of claim 1, wherein the R1 and R1' are the same.

4. The copolymer of claim 1, wherein the R2 is selected from the group consisting of an unsubstituted methyl group, a methyl group substituted with a halogen atom, and a undecyl group.

5. The copolymer of claim 1, wherein the R1 and R1' are each independently a 2-ethylhexyl group, and the R2 is a methyl group.

6. A method for preparing a copolymer represented by Formula 1 below by polymerizing a compound represented by Formula 2 below and a compound represented by Formula 3 below:

Formula 1

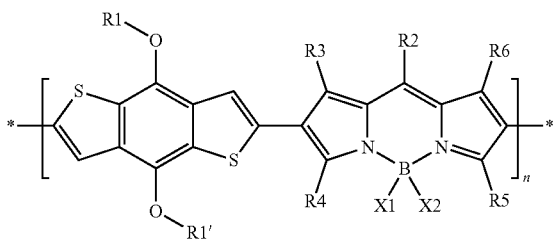

Formula 2

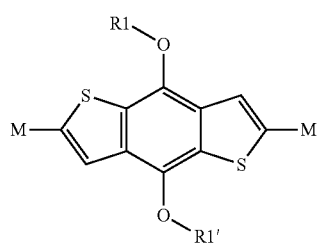

Formula 3

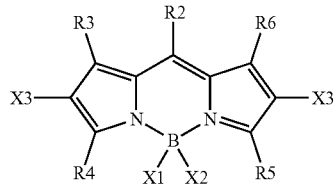

wherein in the formulae,

R1 and R1' are each independently selected from the group consisting of a straight-chain or branched $C_4$ to $C_{30}$ alkyl group, alkenyl group, and alkynyl group, R2 is selected from the group consisting of a straight-chain or branched $C_1$ to $C_{20}$ alkyl group unsubstituted or substituted with a halogen atom, and a straight-chain or branched $C_2$ to $C_{20}$ alkenyl group or alkynyl group, R3 to R6 are each independently selected from the group consisting of a straight-chain or branched $C_1$ to $C_{20}$ alkyl group, and a straight-chain or branched $C_2$ to $C_{20}$ alkenyl group or alkynyl group, M is an organotin compound or an organoboron compound, $X_1$, $X_2$, and $X_3$ are each independently a halogen atom, a repeat number n of a repeating unit is from 2 to 50, and a number average molecular weight (Mn) is from 1400 to 60000, wherein the R1 and R1' are each independently a branched $C_8$ to $C_{24}$ alkyl group, and wherein the copolymer represented by Formula 1 comprises at least one polymer selected from the group consisting of K1 to K6:

K1

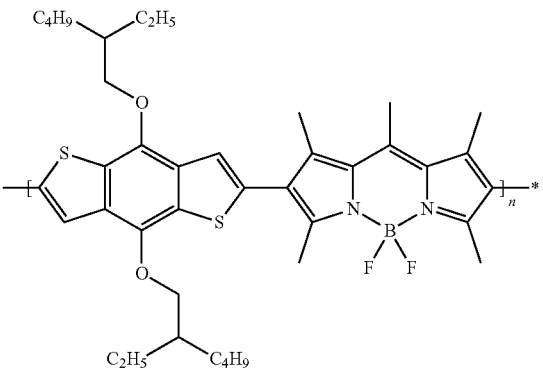

K2

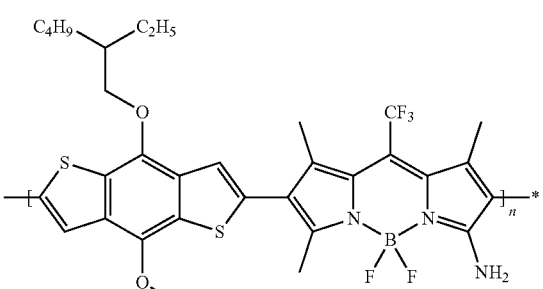

K3

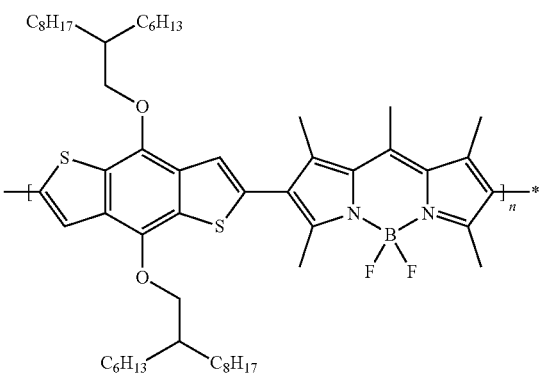

K4

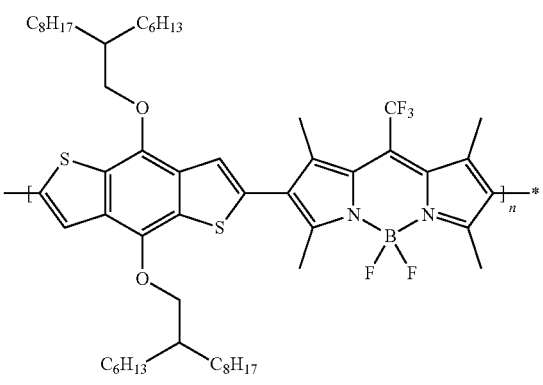

,

-continued

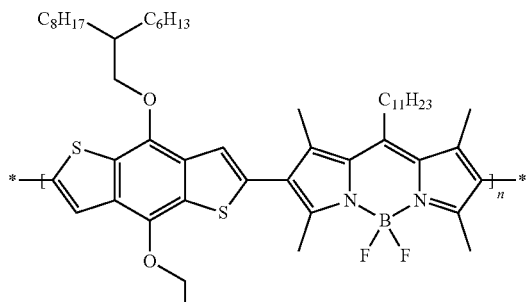
K5

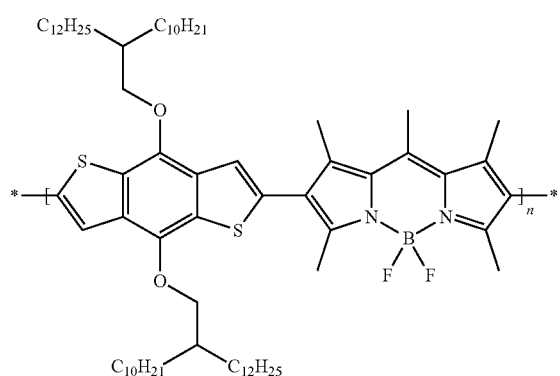
, and
K6

7. The method of claim 6, wherein the compound represented by Formula 2 and the compound represented by Formula 3 are polymerized by SUZUKI reaction or STILLE reaction.

8. A solar cell comprising a copolymer represented by Formula 1 below:

Formula 1

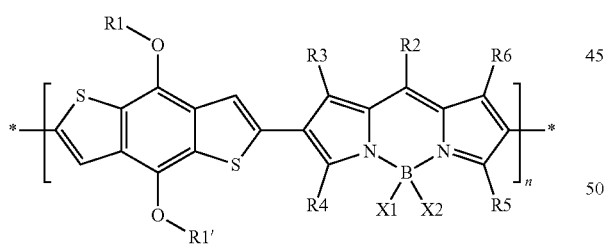

wherein in Formula 1,

R1 and R1' are each independently selected from the group consisting of a straight-chain or branched $C_4$ to $C_{30}$ alkyl group, alkenyl group, and alkynyl group, R2 is selected from the group consisting of a straight-chain or branched $C_1$ to $C_{20}$ alkyl group unsubstituted or substituted with a halogen atom, and a straight-chain or branched $C_2$ to $C_{20}$ alkenyl group or alkynyl group, R3 to R6 are each independently selected from the group consisting of a straight-chain or branched $C_1$ to $C_{20}$ alkyl group, and a straight-chain or branched $C_2$ to $C_{20}$ alkenyl group or alkynyl group, $X_1$ and $X_2$ are each independently a halogen atom, a repeat number n of a repeating unit is from 2 to 50, and a number average molecular weight (Mn) is from 1400 to 60000, wherein the R1 and R1' are each independently a branched $C_8$ to $C_{24}$ alkyl group, and wherein the copolymer represented by Formula 1 comprises at least one polymer selected from the group consisting of K1 to K6:

K1

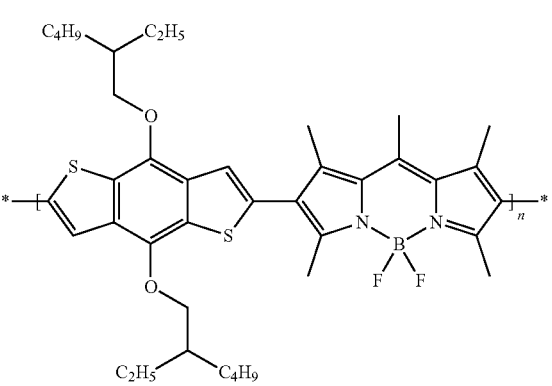
,

K2

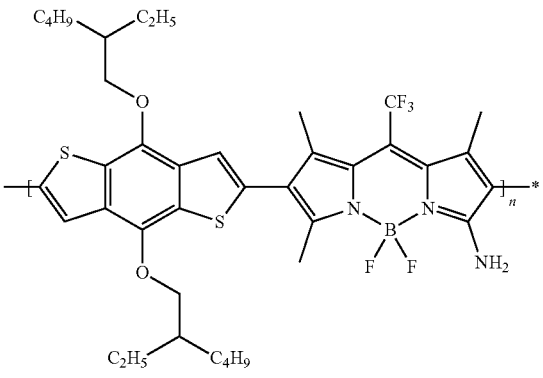
,

K3

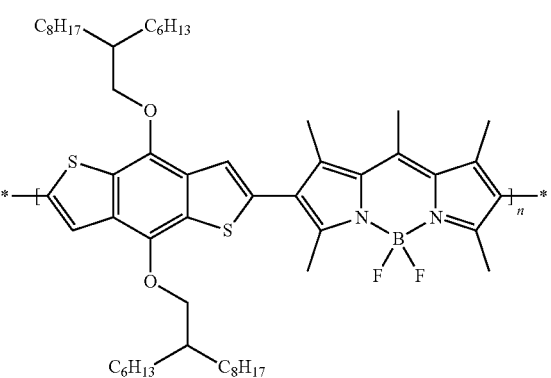
,

K4

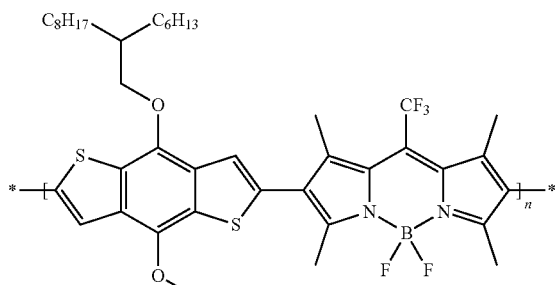

K5

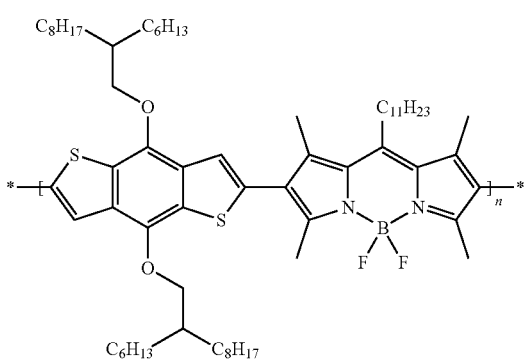

, and

K6

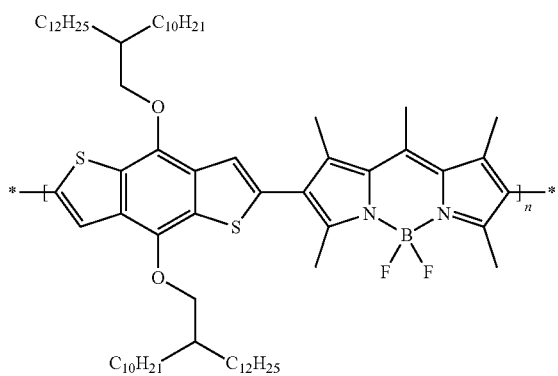

9. The solar cell of claim 8, wherein the solar cell is a perovskite solar cell.

10. The solar cell of claim 8, wherein the solar cell comprises:
a first electrode;
a light absorbing layer provided on the first electrode;
a hole transporting layer provided on the light absorbing layer; and
a second electrode provided on the hole transporting layer,
wherein the hole transporting layer comprises the copolymer.

11. The solar cell of claim 10, wherein the light absorbing layer comprises a metal oxide and a compound having a perovskite structure.

12. The solar cell of claim 11, wherein the compound having a perovskite structure comprises at least one selected from $CH_3NH_3PbI_{3-x}Cl_x$ (where x is a real number satisfying 0≤x≤3), $H_3NH_3PbI_{3-x}Cl_x$ (where x is a real number satisfying 0≤x≤3), $CH_3NH_3PbI_{3-x}Br_x$ (where x is a real number satisfying 0≤x≤3), $CH_3NH_3PbCl_{3-x}Br_x$ (where x is a real number satisfying 0≤x≤3), and $CH_3NH_3PbI_{3-x}F_x$ (where x is a real number satisfying 0≤x≤3).

13. The solar cell of claim 11, wherein the metal oxide is an oxide of at least one metal selected from titanium, aluminum, tin, zinc, tungsten, zirconium, gallium indium, yttrium, niobium, tantalum, and vanadium.

14. The solar cell of claim 8, wherein a P value represented by Equation 1 below is in the range of 0.8 to 1:

$$P=PCE_{10}/PCE_o \qquad \text{Equation 1}$$

wherein in Equation 1 above, $PCE_{10}$ is a power conversion efficiency measured at 10 days after the solar cell is manufactured, and $PCE_o$ is an initial power conversion efficiency measured at the manufacture of the solar cell.

15. A composition for forming a hole transporting layer of a solar cell, the composition comprising a copolymer represented by Formula 1 below:

Formula 1

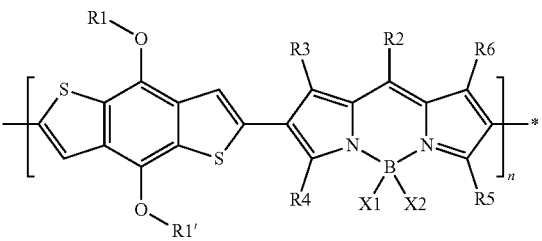

wherein in Formula 1 above,

R1 and R1' are each independently selected from the group consisting of a straight-chain or branched $C_4$ to $C_{30}$ alkyl group, alkenyl group, and alkynyl group, R2 is selected from the group consisting of a straight-chain or branched $C_1$ to $C_{20}$ alkyl group unsubstituted or substituted with a halogen atom, and a straight-chain or branched $C_2$ to $C_{20}$ alkenyl group or alkynyl group, R3 to R6 are each independently selected from the group consisting of a straight-chain or branched $C_1$ to $C_{20}$ alkyl group, and a straight-chain or branched $C_2$ to $C_{20}$ alkenyl group or alkynyl group, $X_1$ and $X_2$ are each independently a halogen atom, a repeat number n of a repeating unit is from 2 to 50, and a number average molecular weight (Mn) is from 1400 to 60000, wherein the R1 and R1' are each independently a branched $C_8$ to $C_{24}$ alkyl group, and wherein the copolymer represented by Formula 1 comprises at least one polymer selected from the group consisting of K1 to K6:

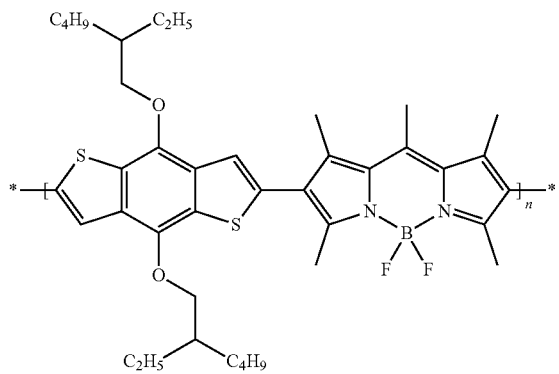

K1

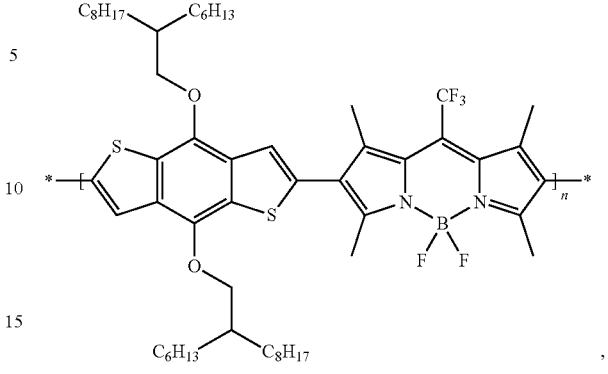

K4

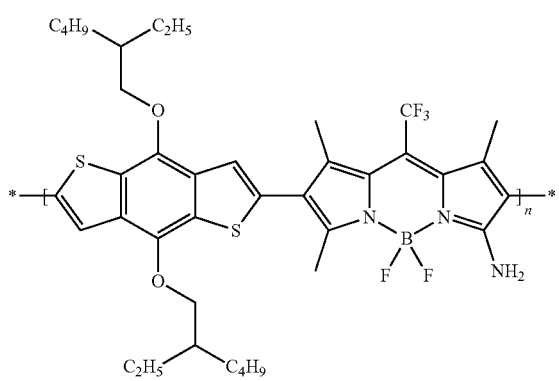

K2

K5

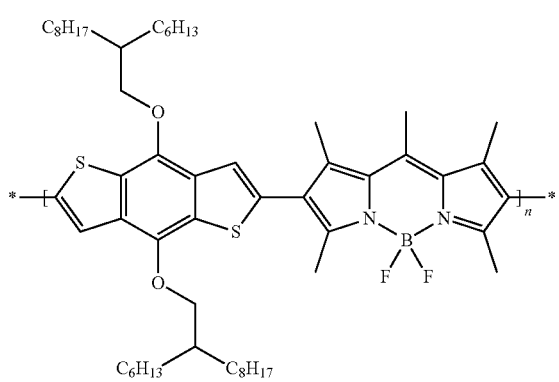

K3

K6

16. The composition of claim 15, wherein the R1 and R1' are each independently selected from the group consisting of a 2-ethylhexyl group, a 2-hexyldecyl group, and a 2-decyltetradecyl group.

17. The composition of claim 15, wherein the R2 is selected from the group consisting of an unsubstituted methyl group, a methyl group substituted with a halogen atom, and a undecyl group.

18. The composition of claim 15, wherein the R1 and R1' are each independently a 2-ethylhexyl group, and the R2 is a methyl group.

* * * * *